(12) United States Patent  (10) Patent No.: US 9,280,050 B2
Sasaki  (45) Date of Patent: Mar. 8, 2016

(54) EXPOSURE APPARATUS AND METHOD OF DEVICE FABRICATION

(71) Applicant: CANON KABUSHIKI KAISHA, Tokyo (JP)

(72) Inventor: Ryo Sasaki, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 14/138,559

(22) Filed: Dec. 23, 2013

(65) Prior Publication Data

US 2014/0186755 A1  Jul. 3, 2014

(30) Foreign Application Priority Data

Dec. 27, 2012 (JP) ................ 2012-284352

(51) Int. Cl.
| | |
|---|---|
| G03B 27/54 | (2006.01) |
| G03B 27/52 | (2006.01) |
| G03B 27/42 | (2006.01) |
| G03F 7/20 | (2006.01) |

(52) U.S. Cl.
CPC .............. *G03F 7/20* (2013.01); *G03F 7/70558* (2013.01); *G03F 7/70933* (2013.01)

(58) Field of Classification Search
CPC .. G03F 7/70558; G03F 7/70933; G03G 7/702
USPC ......................................... 355/30, 53, 67–69
See application file for complete search history.

(56) References Cited

U.S. PATENT DOCUMENTS

| | | | |
|---|---|---|---|
| 6,295,121 B1* | 9/2001 | Nakamura | 355/67 |
| 2001/0015795 A1* | 8/2001 | Nishi | 355/53 |
| 2004/0184015 A1* | 9/2004 | Kino | 355/30 |
| 2005/0175497 A1* | 8/2005 | Arai et al. | 422/3 |
| 2006/0033893 A1* | 2/2006 | Nakano | 355/30 |
| 2011/0102754 A1 | 5/2011 | Takagi et al. | |
| 2014/0185026 A1 | 7/2014 | Sasaki | |

FOREIGN PATENT DOCUMENTS

| | | |
|---|---|---|
| JP | 61-051150 A | 3/1986 |
| JP | 01-195445 A | 8/1989 |
| JP | 2011096859 A | 5/2011 |

OTHER PUBLICATIONS

Office Action issued in U.S. Appl. No. 14/138,425, mailed Feb. 23, 2015.
Notice of Allowance issued in U.S. Appl. No. 14/138,425, mailed Sep. 30, 2015.
Final Office Action issued in related U.S. Appl. No. 14/138,425, dated Jul. 14, 2015.

* cited by examiner

*Primary Examiner* — Hung Henry Nguyen
(74) *Attorney, Agent, or Firm* — Rossi, Kimms & McDowell LLP

(57) ABSTRACT

The present invention provides an exposure apparatus which exposes a substrate, the apparatus including an adjustment unit configured to adjust an oxygen concentration in a space between the projection optical system and the substrate, a measuring unit configured to measure an illuminance of light applied to the substrate, and a control unit configured to control the measuring unit so as to measure illuminances of light applied to the substrate a plurality of times during irradiation of the substrate with light from the projection optical system, configured to calculate, based on each of the illuminances measured the plurality of times, an oxygen concentration value corresponding to the measured illuminance on each time and configured to control the adjustment unit so as to set the oxygen concentration in the space to the calculated oxygen concentration value.

16 Claims, 6 Drawing Sheets

EXPOSURE APPARATUS AND METHOD OF DEVICE FABRICATION

BACKGROUND OF THE INVENTION

1. Field of the Invention

The present invention relates to an exposure apparatus and a method of device fabrication.

2. Description of the Related Art

There are available various types of methods of manufacturing a color filter such as a dyeing method, printing method, electrodeposition/electrolysis method, and pigment dispersion method. Among these methods, the pigment dispersion method has been the mainstream because of its manufacturing stability and simplicity. A photosensitive acrylic method as a typical pigment dispersion method forms a pattern by photolithography on a color resist containing an acryloid-based photosensitive resin and having both a coloring function and a photosensitive function.

A color resist is a negative resist. For this reason, irradiating the resist with exposure light will generate radicals contributing to a reaction and photopolymerize a polymer, thereby making it insoluble to a developer. Note however that the pigment components contained in the color resist easily absorb exposure light and the generated radicals are trapped in oxygen in air. This tends to hinder a photopolymerization reaction. In order to obtain predetermined pattern dimensions (or shape), therefore, it is necessary to increase the dose (exposure energy), leading to a decrease in throughput.

Under the circumstance, there has been proposed a technique of forming (applying) a film made of polyvinyl alcohol (oxygen shielding film which shields against oxygen) on a resist. Such a technique may cause a pattern defect due to the poor wettability of the oxygen shielding film on the resist. In addition, adding the step of forming an oxygen shielding film will increase the cost. Furthermore, it is not possible to control the oxygen concentration even by forming an oxygen shielding film. This reduces flexibility with respect to accuracy control on pattern dimensions when forming a fine pattern.

On the other hand, Japanese Patent Laid-Open No. H1-195445 has proposed a technique of exposing a resist in a low oxygen state upon blowing nitrogen (gas) against the resist without forming any oxygen shielding film made of polyvinyl alcohol on the resist. Japanese Patent Laid-Open No. S61-51150 has also proposed a technique of exposing a substrate separately in the first exposure step of exposing the substrate in an inert gas atmosphere and the second exposure step of exposing the substrate in an active gas atmosphere in order to obtain a high-resolution resist image.

According to the conventional technique, the hindrance of a photopolymerization reaction by oxygen is suppressed by setting different oxygen concentrations on a substrate (resist) in the first and second exposure steps, thereby obtaining predetermined pattern dimensions. In this case, if the illuminance of exposure light on a substrate decreases due to a decrease in the transmittance of an optical system or a decrease in the emission intensity of a light source, the photopolymerization reaction on the resist may change. If the photopolymerization reaction on the resist changes, the conventional technique of exposing a substrate in a plurality of steps may not obtain predetermined pattern dimensions. It is therefore conceivable to optimize pattern dimensions by increasing the dose. This will, however, decrease the throughput.

SUMMARY OF THE INVENTION

The present invention provides an exposure apparatus which is advantageous in transferring a pattern onto a substrate while suppressing a decrease in throughput.

According to one aspect of the present invention, there is provided an exposure apparatus which exposes a substrate, the apparatus including an illumination optical system configured to illuminate a mask using light from a light source, a projection optical system configured to irradiate the substrate with light from a pattern on the mask, an adjustment unit configured to adjust an oxygen concentration in a space between the projection optical system and the substrate, a measuring unit configured to measure an illuminance of light applied to the substrate, and a control unit configured to control the measuring unit so as to measure illuminances of light applied to the substrate a plurality of times during irradiation of the substrate with light from the projection optical system, configured to calculate, based on each of the illuminances measured the plurality of times, an oxygen concentration value corresponding to the measured illuminance on each time and configured to control the adjustment unit so as to set the oxygen concentration in the space to the calculated oxygen concentration value.

Further aspects of the present invention will become apparent from the following description of exemplary embodiments with reference to the attached drawings.

DESCRIPTION OF THE EMBODIMENTS

Figure 1:
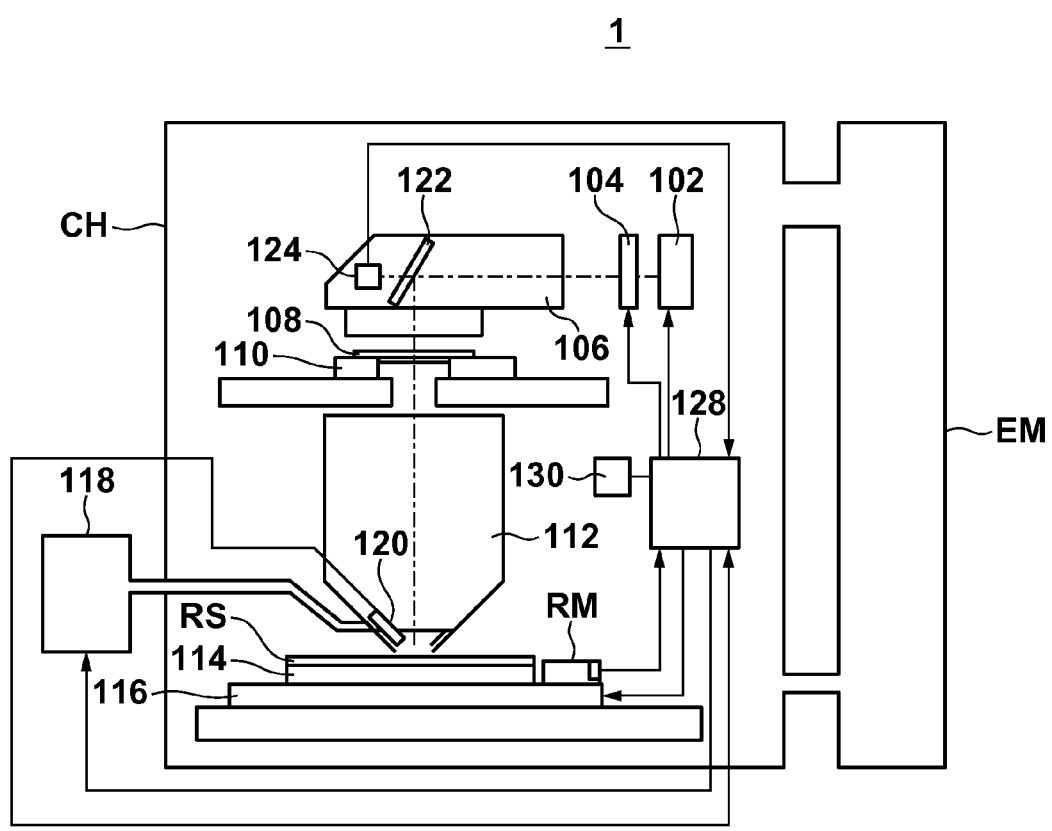
FIG. 1 is a schematic view showing the arrangement of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 1 according to an aspect of the present invention. The exposure apparatus 1 is a lithography apparatus which performs a transfer process of transferring a reticle (mask) pattern onto a substrate by the step and scan scheme. Note however that the exposure apparatus 1 can also use other exposure schemes such as the step and repeat scheme.

The exposure apparatus 1 includes a light source 102, a dimming unit 104, an illumination optical system 106, a reticle stage 110 which moves while holding a reticle 108, a projection optical system 112, and a substrate stage 116 which moves while holding a substrate 114. The exposure apparatus 1 also includes a gas supply unit 118, an oxygen meter 120, a beam splitter 122, an integration sensor 124, a measuring instrument 126, a control unit 128, and a storage unit 130. The respective units of the exposure apparatus 1 are arranged in a chamber CH which defines an exposure chamber. The atmosphere in the chamber CH is maintained at an air atmosphere whose temperature and humidity are controlled by an atmosphere maintaining unit EM.

The light emitted from the light source 102 such as a mercury lamp, ArF excimer laser, or KrF excimer laser passes through the dimming unit 104 and the illumination optical system 106 and illuminates the reticle 108. The light which has passed through the pattern on the reticle 108 is projected onto a resist RS applied on the substrate 114 through the projection optical system 112. The dimming unit 104 functions as an adjustment unit for adjusting the light emitted from the light source 102, that is, the illuminance of the light applied to the substrate 114, and is formed from an ND filter in this embodiment. Note however that it is possible to adjust the illuminance of light by changing the voltage applied to the mercury lamp forming the light source 102 or changing the distance between the light source 102 and the illumination optical system 106.

The reticle stage 110 movably holds the reticle 108. The substrate stage 116 movably holds the substrate 114. A reference mark RM for calibration is formed on an end portion of the substrate stage 116.

The gas supply unit 118 supplies an inert gas to the space (local space) between the projection optical system 112 and the substrate 114 (substrate stage 116). In this embodiment, the gas supply unit 118 supplies either a mixed gas of air and an inert gas or air to the local space through a gas supply nozzle. The inert gas includes, for example, a nitrogen gas. The gas supply unit 118 may also be configured to separately contain a plurality of types of mixed gases with different composition ratios between inert gas and air and different oxygen concentrations and change the oxygen concentration in the local space replaced with a mixed gas. It is preferable to almost close the local space replaced with the gas supplied from the gas supply unit 118 with a partition wall or the like enclosing it to efficiently decrease the oxygen concentration by preventing the mixed gas from dispersing when exposing the substrate 114.

The oxygen meter (concentration measuring unit) 120 is placed near the local space between the projection optical system 112 and the substrate 114 to measure the oxygen concentration in the local space. The oxygen meter 120 can also be placed at a position where it can perform alternative measurement of the oxygen concentration between the projection optical system 112 and the substrate 114. For example, placing the oxygen meter 120 between the gas supply unit 118 and projection optical system 112 (near its final surface) can perform alternative measurement of the oxygen concentration in the local space.

The beam splitter 122 splits light (exposure light) for illuminating the reticle 108 after passing through the illumination optical system 106 into light propagating toward the substrate 114 and light propagating toward the integration sensor 124 at a light intensity ratio of, for example, 1:1/several millions. The integration sensor 124 is used to indirectly measure the integrated amount (dose) of exposure light applied to the substrate 114 by integrating the amount of light (light amount) entering the integration sensor 124.

The measuring instrument (measuring unit) 126 is placed on the substrate stage 116 to measure the illuminance and illuminance distribution of light entering the surface on which the substrate 114 is placed, that is, the image plane of the projection optical system 112. In other words, the measuring instrument 126 has a function of obtaining the illuminance data and illuminance distribution data of light applied to the substrate 114. The measuring instrument 126 includes, for example, a light shielding plate having a pinhole and a photoelectric conversion device which detects light passing through the pinhole. The photoelectric conversion device included in the measuring instrument 126 is not limited to one photoelectric conversion device but may be a line sensor or image sensor including a plurality of photoelectric conversion devices. Information concerning the area of the pinhole of the light shielding plate is stored in the storage unit 130 and used to obtain illuminance based on an output from the measuring instrument 126.

When measuring the illuminance of light applied to the substrate 114, the apparatus moves the substrate stage 116 to place the measuring instrument 126 near a target measurement position. When measuring the illuminance distribution of light applied to the substrate 114, the apparatus causes the measuring instrument 126 to measure illuminance while performing, for example, step movement of the substrate stage 116 with a predetermined step width. The apparatus then obtains the illuminance distribution of light applied to the substrate 114 based on a plurality of positions of the substrate stage 116 (that is, a plurality of positions of the measuring instrument 126) and a plurality of illuminances measured by the measuring instrument 126 at the respective positions.

The control unit 128 includes a CPU and the like and controls the overall (operation) exposure apparatus 1. In this embodiment, the control unit 128 controls a transfer process of transferring the pattern on the reticle 108 onto the substrate 114 through the light source 102, the dimming unit 104, the reticle stage 110, the substrate stage 116, the gas supply unit 118, and the like. For example, the control unit 128 controls the supply of a mixed gas (inert gas) by the gas supply unit 118, based on the oxygen concentration measured by the oxygen meter 120, so as to set the oxygen concentration in the local space between the projection optical system 112 and the substrate 114 to a target oxygen concentration. The control unit 128 controls the light intensity of light emitted from the light source 102 and the transmittance at the dimming unit 104 based on the dose measured by the integration sensor 124. In addition, the control unit 128 calculates the illuminance of light entering the substrate 114 from an output from the measuring instrument 126 and controls the light intensity of light emitted from the light source 102 and the transmittance at the dimming unit 104 based on the calculated illuminance. In this case, the control unit 128 uses an output from the measuring instrument 126 as a reference for the calibration of the integration sensor 124. Obtaining the correlation between the illuminance measured by the measuring instrument 126 and the dose measured by the integration sensor 124 in advance allows the control unit 128 to calculate the illuminance of light entering the substrate 114 based on the dose measured by the integration sensor 124. The control unit 128 can adjust the illuminance during an exposure process by controlling the light intensity of light emitted from the light source 102 or the transmittance at the dimming unit 104 based on the calculated illuminance.

Figure 2:
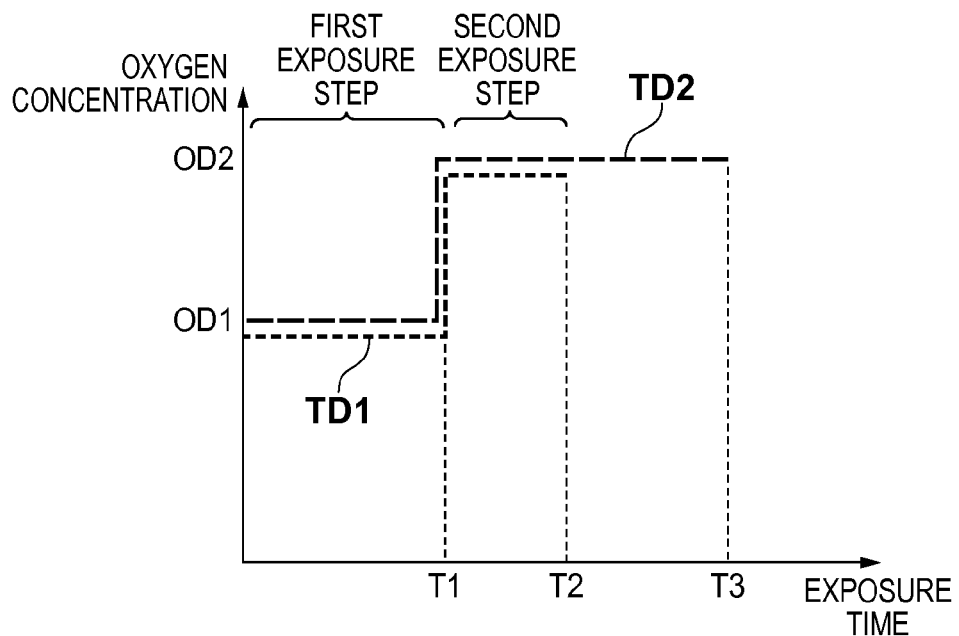
FIG. 2 is a graph for explaining an exposure process of exposing a substance separately in the first and second exposure steps.

An exposure process in the exposure apparatus 1 will be described. The exposure process disclosed in Japanese Patent Laid-Open No. 61-51150, that is, the exposure process of exposing the substrate 114 separately in the first and second exposure steps, will be described first with reference to FIG. 2. FIG. 2 is a graph showing the relationship between exposure time and oxygen concentration (the oxygen concentration in the local space between the projection optical system 112 and the substrate 114) in an exposure process of exposing the substrate 114 separately in the first and second exposure steps. FIG. 2 uses the exposure time as the abscissa and the oxygen concentration as the ordinate.

Referring to FIG. 2, TD1 represents the relationship between exposure time and oxygen concentration in a case in which the illuminance of light applied to the substrate 114 is a predetermined illuminance. In the first exposure step, the apparatus exposes the substrate 114 from time 0 to time T1 in an atmosphere in which the oxygen concentration in the local space between the projection optical system 112 and the substrate 114 is an oxygen concentration OD1. In the second exposure step, the apparatus exposes the substrate 114 from time T1 to time T2 in an atmosphere in which the oxygen concentration in the local space between the projection optical system 112 and the substrate 114 is an oxygen concentration OD2.

However, continuing exposure may decrease the illuminance of light applied to the substrate 114 (that is, may fail to obtain a predetermined illuminance). If, for example, the light source 102 deteriorates, especially when a mercury lamp is used as the light source 102, it is known that the illuminance decreases by about 30% in two months. In addition, the transmittance of the illumination optical system 106 or projection optical system 112 decreases in a medium and long term. In this case, even if the light source 102 is replaced, it is not possible to implement optimal illuminance corresponding to the type of resist. This makes it impossible to make the dimensions of a pattern transferred onto the substrate 114 fall within allowable ranges.

In general, when exposing the substrate 114 (the resist RS applied to it), the apparatus transfers the pattern on the reticle 108 onto the substrate 114 while maintaining the dose (exposure energy) constant. Since a dose is represented by the product of an illuminance and an exposure time, it is necessary to prolong the exposure time while the illuminance is low.

Referring to FIG. 2, TD2 represents the relationship between exposure time and oxygen concentration in a case in which the illuminance of light applied to the substrate 114 has decreased from a predetermined illuminance. In order to avoid a decrease in dose due to a decrease in illuminance, in the second exposure step, the apparatus exposes the substrate 114 from time T1 to time T3. Increasing the exposure time in this manner will decrease the throughput. In this case, the exposure time in the second exposure step is increased. However, increasing the exposure time in the first exposure step or both in the first and second exposure steps will decrease the throughput.

Figure 3:
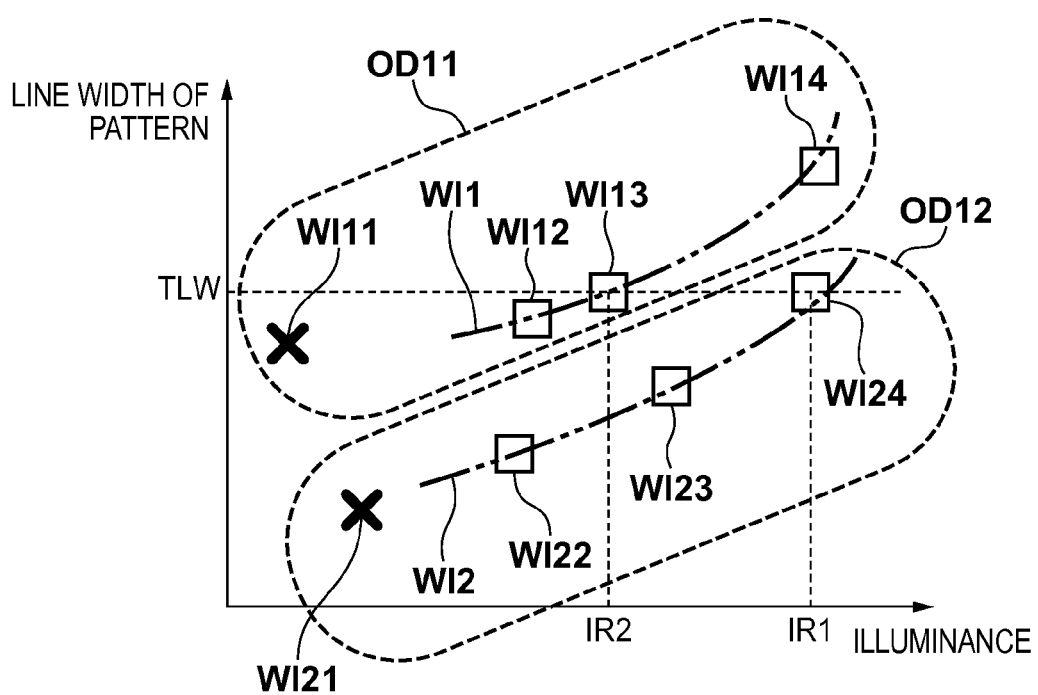
FIG. 3 is a graph showing the relationship between the illuminance of light applied to a substrate and the line width of a pattern transferred onto a substrate.

The relationship between the illuminance of light applied to the substrate 114 and the line width of a pattern transferred onto the substrate 114 will be described next with reference to FIG. 3. FIG. 3 uses the illuminance of light applied to the substrate 114 as the abscissa and the line width of a pattern transferred onto the substrate 114 as the ordinate.

Referring to FIG. 3, WI11, WI12, WI13, and WI14 represent the results obtained by exposing the substrate 114 in an atmosphere in which the oxygen concentration in the local space between the projection optical system 112 and the substrate 114 is an oxygen concentration OD11. WI1 represents a function approximating the results represented by WI12 to WI14. In addition, WI21, WI22, WI23, and WI24 represent the results obtained by exposing the substrate 114 in an atmosphere in which the oxygen concentration in the local space between the projection optical system 112 and the substrate 114 is an oxygen concentration OD12. WI2 represents a function approximating the results represented by WI22 to WI24. Note that WI11 and WI21 indicate that energy sufficient for a photopolymerization causing substance in the resist has not been supplied because of a lack in illuminance at the time of an exposure process, and no pattern has been resolved.

Obviously from FIG. 3, in order to obtain a line width TWL of a pattern (target pattern) to be transferred onto the substrate 114, when performing exposure with the oxygen concentration OD1 in the local space, the apparatus sets the illuminance of light applied to the substrate 114 to an illuminance IR1. As the illuminance of light applied to the substrate 114 decreases, the photopolymerization reaction decreases, resulting in variations in the line width of the pattern transferred onto the substrate 114. In general, to increase a photopolymerization reaction, it is conceivable to increase the dose. It is however necessary to prolong the exposure time, resulting in a reduction in throughput.

On the other hand, when the apparatus performs exposure with a decreased oxygen concentration in the local space between the projection optical system 112 and the substrate 114, since the hindrance of a photopolymerization reaction by oxygen decreases, the photopolymerization reaction of the resist progresses, resulting in variations in the line width of the pattern transferred onto the substrate 114. Therefore, while the illuminance has decreased from the illuminance IR1 to an illuminance IR2, it is possible to obtain the line width TLW of the target pattern by performing exposure upon decreasing the oxygen concentration in the local space from the oxygen concentration OD12 to the oxygen concentration OD11. In addition, since it is possible to obtain the line width TLW of the target pattern by reducing the hindrance of a photopolymerization reaction by oxygen, it is not necessary to increase the dose. This can prevent a decrease in throughput.

Figure 4:
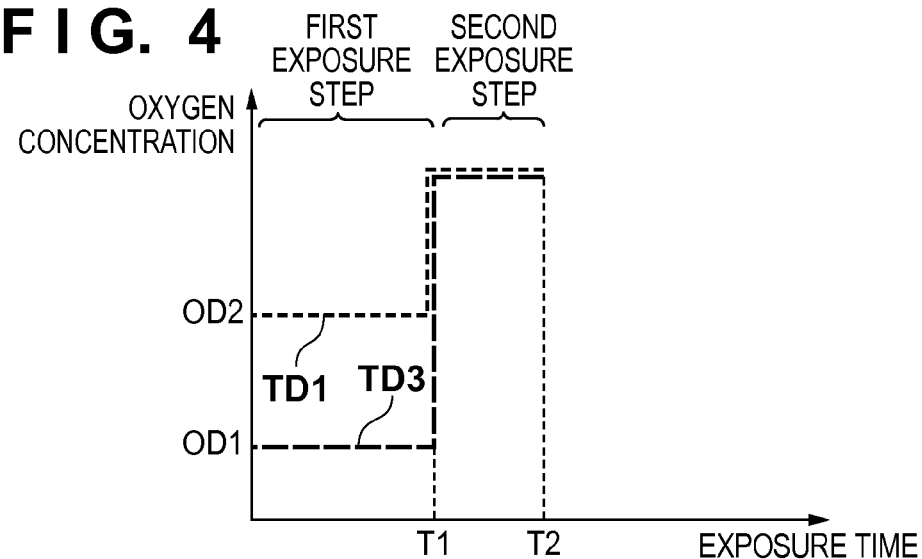
FIG. 4 is a graph for explaining an exposure process of exposing a substrate separately in the first and second exposure steps.

The prevention of a decrease in throughput based on the oxygen concentration in the local space between the projection optical system 112 and the substrate 114 will be described with reference to FIG. 4. FIG. 4 is a graph showing the relationship between exposure time and oxygen concentration in an exposure process of exposing the substrate 114 separately in the first and second exposure steps. FIG. 4 uses the exposure time as the abscissa and the oxygen concentration as the ordinate.

Referring to FIG. 4, TD3 represents the relationship between exposure time and oxygen concentration in a case in which the illuminance of light applied to the substrate 114 has decreased from a predetermined illuminance. As described above, as the illuminance of light applied to the substrate 114 decreases, the photopolymerization reaction also decreases. This makes it impossible to make the line width of a pattern transferred onto the substrate 114 fall within an allowable range. However, reducing the hindrance of a photopolymerization reaction by oxygen concentration by decreasing the oxygen concentration in the local space between the projection optical system 112 and the substrate 114 can promote the photopolymerization reaction. This makes it unnecessary to increase the exposure time, and hence it is possible to make the pattern transferred onto the substrate 114 fall within an allowable range without decreasing the throughput.

Figure 5:
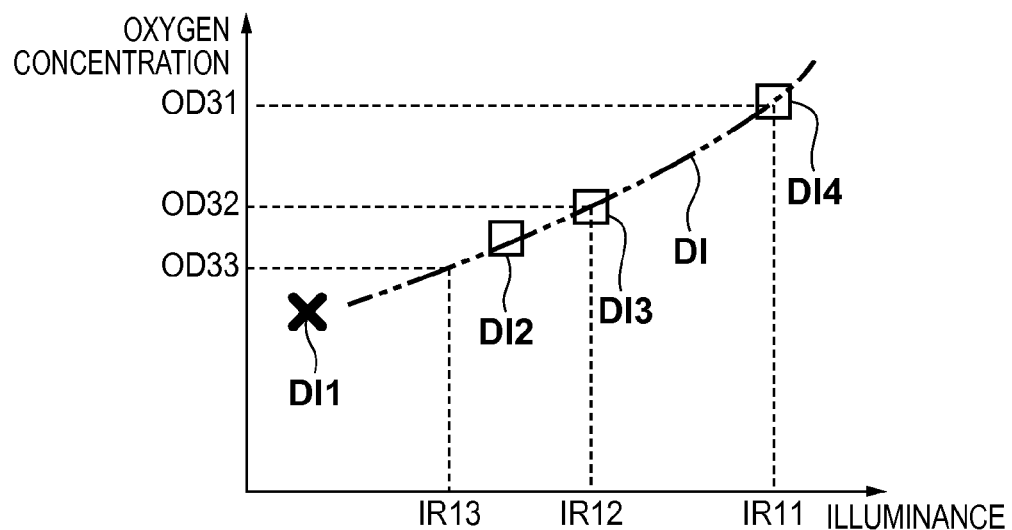
FIG. 5 is a graph showing the relationship between the illuminance of light applied to a substrate and the oxygen concentration in the local space between a projection optical system and a substrate.

A method of deciding the oxygen concentration in the local space between the projection optical system 112 and the substrate 114 in the first exposure step in a case in which the illuminance of light applied to the substrate 114 has decreased will be described next with reference to FIG. 5. FIG. 5 is a graph showing the relationship between the illuminance of light applied to the substrate 114 and the oxygen concentration in the local space between the projection optical system 112 and the substrate 114. FIG. 5 uses the illuminance as the abscissa and the oxygen concentration as the ordinate.

Referring to FIG. 5, DI2, DI3, and DI4 represent the correspondence relationship between illuminance and oxygen concentration which is required to make the dimensions of a pattern transferred onto the substrate 114 fall within allowable ranges, and DI indicates a function (approximation function) approximating the correspondence relationship represented by DI2 to DI4. DI1 indicates a case (the correspondence relationship between illuminance and oxygen concentration) in a case in which it is not possible to make the dimensions of a pattern transferred onto the substrate 114 fall within allowable ranges.

Referring to FIG. 5, obviously, if the illuminance of light applied to the substrate 114 is an illuminance IR11, it is possible to make the dimensions of a pattern transferred onto the substrate 114 fall within allowable ranges by setting the oxygen concentration in the local space between the projection optical system 112 and the substrate 114 to an oxygen concentration OD31. If the illuminance of light applied to the substrate 114 has decreased to an illuminance IR12, in order to make the dimensions of a pattern transferred onto the substrate 114 fall within allowable ranges, the oxygen concentration in the local space between the projection optical system 112 and the substrate 114 may be set to an oxygen concentration OD32. In addition, it is possible to calculate an optimal oxygen concentration OD33 corresponding to an arbitrary illuminance IR3 by referring to the approximation function DI.

As shown in FIG. 4, this embodiment has exemplified the case in which the apparatus decreases the oxygen concentration in the local space between the projection optical system 112 and the substrate 114 in the first exposure step. Note however that the apparatus may decrease the oxygen concentration in the local space in the second exposure step or both in the first and second exposure steps. In addition, the apparatus may calculate exposure times and oxygen concentrations in the first and second exposure steps in advance with respect to each illuminance of light applied to the substrate 114 so as to make the dimensions of a pattern transferred onto the substrate 114 fall within allowable ranges.

Figure 6:
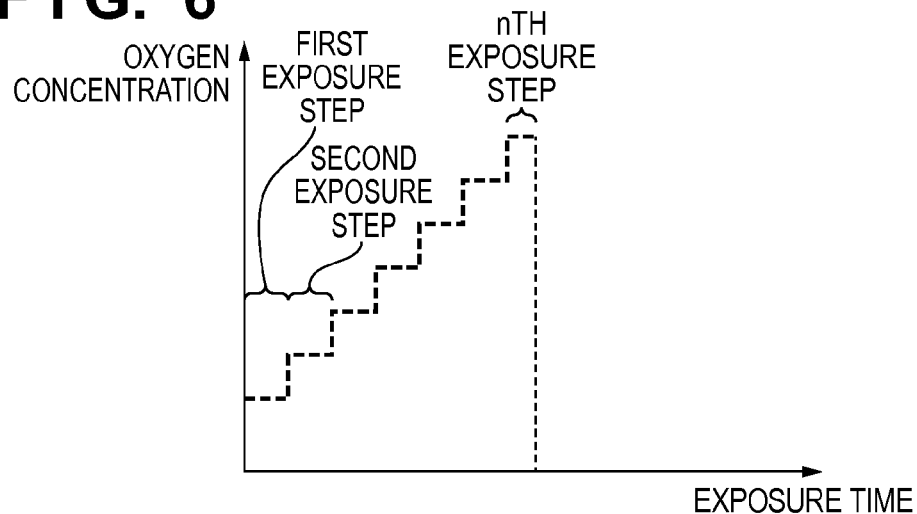
FIG. 6 is a graph showing the relationship between exposure time and oxygen concentration in an exposure process of exposing a substrate separately in the first exposure step, the second exposure step, . . . , the nth exposure step.

Alternatively, the apparatus may change the oxygen concentration in the local space between the projection optical system 112 and the substrate 114 stepwise separately in the first exposure step, the second exposure step, ..., the nth exposure step, as shown in FIG. 6, instead of exposing the substrate 114 separately in the first and second exposure steps (that is, two steps). This makes it possible to control a photopolymerization reaction on a resist more finely and improve the line width of a pattern transferred onto the substrate 114. FIG. 6 is a graph showing the relationship between exposure time and oxygen concentration in an exposure process of exposing the substrate 114 separately in the first exposure step, the second exposure step, ..., the nth exposure step. FIG. 6 uses the exposure time as the abscissa and the oxygen concentration as the ordinate.

An example of an exposure process in the exposure apparatus 1 will be described with reference to FIG. 7. This exposure process is a process of transferring one pattern onto a shot region by exposing the substrate 114 separately in the first exposure step, the second exposure step, ..., the nth exposure step, that is, exposing the substrate 114 within the same short region a plurality of times. As described above, the control unit 128 performs the exposure process shown in FIG. 7 by comprehensively controlling the respective units of the exposure apparatus 1.

In the exposure apparatus 1, the optimal value of the oxygen concentration in the local space between the projection optical system 112 and the substrate 114, the optimal value of the illuminance of light applied to the substrate 114, and the optimal value of the dose on the substrate vary in accordance with the type of resist RS applied to the substrate 114. In this case, the "optimal values" are the oxygen concentration in the local space, the illuminance of light applied to the substrate 114, and the dose on the substrate which are required to make the dimensions of a pattern transferred onto the substrate 114 fall within allowable ranges, respectively. Therefore, the relationship between oxygen concentration, illuminance, and dose for the dimensions of a pattern to be transferred onto the substrate 114 is obtained in advance by experiments and the like and stored in the storage unit 130. In this case, such a relationship may be stored as an exposure recipe instead of being singly stored. If the resist RS to be applied to the substrate 114 is a resist selected from a plurality of color resists, blue, green, and red resists differ in oxygen concentration, illuminance, and dose for the dimensions of a pattern to be transferred onto the substrate 114. This embodiment therefore obtains information representing the correspondence relationship between oxygen concentration, illuminance, and dose for the dimensions of a pattern to be transferred onto the substrate 114 for each type of resist and stores the information as an exposure recipe in the storage unit 130.

Figure 7:
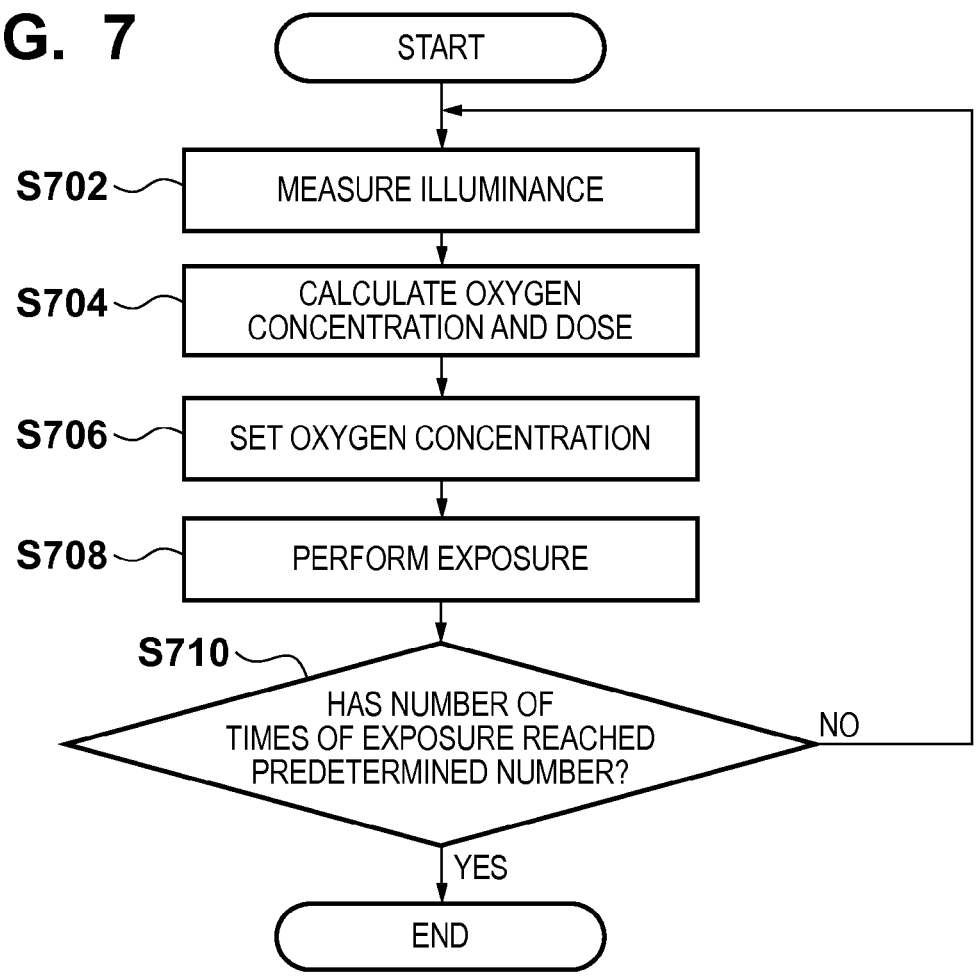
FIG. 7 is a flowchart for explaining an example of an exposure process in the exposure apparatus shown in FIG. 1.

Referring to FIG. 7, in step S702, the control unit 128 measures the illuminance of light applied to the substrate 114 by using the integration sensor 124 or the measuring instrument 126. If the storage unit 130 or the like stores illuminance information, the control unit 128 may obtain the data of the illuminance of light applied to the substrate 114 from the illuminance information instead of actually measuring the illuminance of the light applied to the substrate 114. In this case, illuminance information is information representing the illuminance of light applied to the substrate 114 and a temporal deterioration in illuminance at each time.

In step S704, the control unit 128 calculates an oxygen concentration and a dose which are required to make the dimensions of a pattern transferred onto the substrate 114 fall within allowable ranges, based on the illuminance measured in step S702 and the correspondence relationship between illuminance and oxygen concentration stored in the storage unit 130. Note however that the control unit 128 may obtain the data of oxygen concentration and dose required for an exposure process (required to make the dimensions of a pattern transferred onto the substrate 114 fall within allowable ranges) from the exposure recipe stored in the storage unit 130.

In step S706, the control unit 128 sets an oxygen concentration in the local space between the projection optical system 112 and the substrate 114. More specifically, the control unit 128 controls the gas supply unit 118 to set the oxygen concentration in the local space to the oxygen concentration calculated in step S704 by using the oxygen meter 120.

In step S708, the control unit 128 exposes the substrate 114 (the resist RS applied on it). More specifically, the control unit 128 starts to expose the substrate 114 in the oxygen concentration atmosphere set in step S706 (that is, starts to irradiate the substrate 114 with exposure light from the projection optical system 112). When the dose on the substrate reaches the dose calculated (or obtained) in step S704, the control unit 128 finishes exposing the substrate 114 (that is, finishes irradiating the substrate 114 with exposure light from the projection optical system 112).

In step S710, the control unit 128 determines whether the number of times of exposure has reached a predetermined number (n), that is, the apparatus has finished the nth exposure step. If the number of times of exposure has not reached the predetermined number, the process shifts to step S702 to perform the next exposure step to measure the illuminance of light applied to the substrate 114. When obtaining the data of an oxygen concentration and dose from the exposure recipe stored in the storage unit 130, the process may shift to step S704. If the number of times of exposure has reached the predetermined number, the control unit 128 terminates the processing.

As described above, according to the exposure process shown in FIG. 7, the apparatus measures the illuminance of light a plurality of times while the substrate 114 is irradiated with light from the projection optical system 112, and calculates an oxygen concentration based on the measured illuminance. This makes it possible to expose the substrate 114 in an optical oxygen concentration state even if the illuminance of light applied to the substrate 114 has decreased. It is therefore possible to make the dimensions of a pattern transferred onto the substrate 114 fall within allowable ranges while suppressing an increase in does which is a cause of a decrease in throughput.

This embodiment has exemplified the line width of a pattern as an example of the dimensions of the pattern transferred onto the substrate 114. Note however that the dimensions of a pattern transferred onto the substrate 114 are not limited to the line width of the pattern and may be a pattern shape including verticality on a side surface of the pattern or other arbitrary evaluation indices for a pattern.

Figure 8:
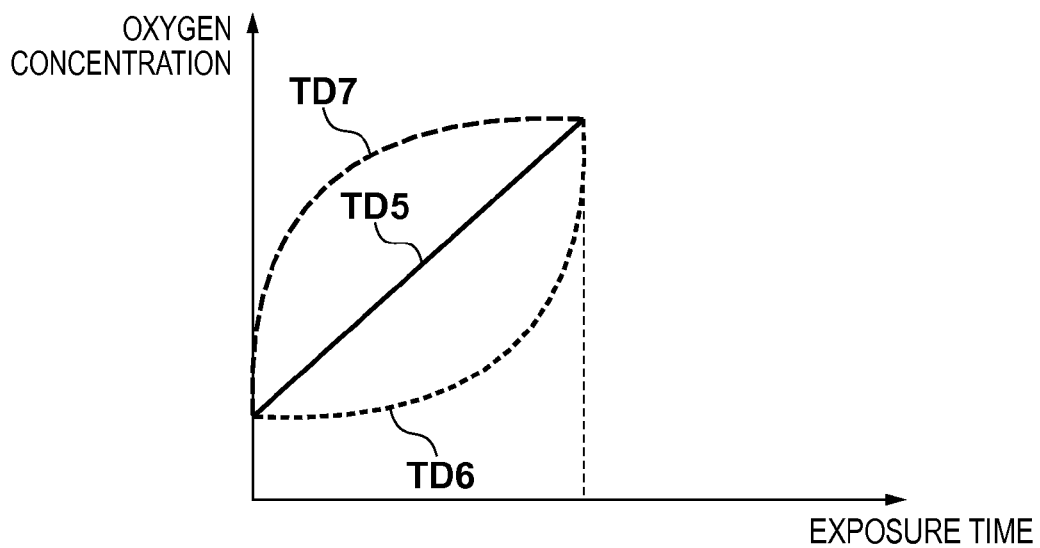
FIG. 8 is a graph showing the relationship between exposure time and oxygen concentration in an exposure process.

Alternatively, the apparatus may continuously change the oxygen concentration in the local space between the projection optical system 112 and the substrate 114 during one exposure (during the irradiation of the substrate 114 with light from the projection optical system 112), as shown in FIG. 8, instead of performing exposing in multiple steps (stepwise). FIG. 8 is a graph showing the relationship between exposure time and oxygen concentration in an exposure process. FIG. 8 uses the exposure time as the abscissa and the oxygen concentration as the ordinate. Referring to FIG. 8, TD5 represents the relationship between exposure time and oxygen concentration in a case in which the oxygen concentration in the local space between the projection optical system 112 and the substrate 114 is linearly changed.

When changing the oxygen concentration in the local space between the projection optical system 112 and the substrate 114, the apparatus supplies a mixed gas of an inert gas and air from the gas supply unit 118. Immediately after the supply of the mixed gas from the gas supply unit 118, since the mixed gas mixes with the air existing in the local space, it requires a certain wait time to stabilize the oxygen concentration in the local space. Although not shown in FIG. 2, therefore, it requires a certain wait time (for the stabilization of an oxygen concentration) between the first and second exposure steps due to a change in the oxygen concentration in the local space.

Referring to FIG. 8, because the apparatus continuously and slightly changes the oxygen concentration in the local space in accordance with the elapsed time (exposure time) of exposure on the substrate, it requires no wait time to stabilize the oxygen concentration. For example, the gas supply unit 118 continuously changes the actual oxygen concentration in the local space by changing the supply amount of gas upon setting a continuously changing oxygen concentration as a target value as shown in FIG. 8. This can greatly shorten the wait time for the stabilization of an oxygen concentration, and hence can improve the throughput as compared with the related art.

As indicated by TD6 and TD7, the apparatus may curvilinearly change the oxygen concentration in the local space between the projection optical system 112 and the substrate 114 instead of linearly changing (TD5) the oxygen concentration in the local space between the projection optical system 112 and the substrate 114. As described above, the relationship between exposure time and oxygen concentration is expressed by a continuous function expressed by a straight line, a smooth curve, or the like. In other words, the oxygen concentration in the local space between the projection optical system 112 and the substrate 114 may be changed to make the dimensions of a pattern transferred onto the substrate 114 fall within allowable ranges.

The description so far is a case in which the apparatus controls a photopolymerization reaction to make the dimensions of a pattern transferred onto the substrate 114 fall within allowable ranges by changing the oxygen concentration in the local space between the projection optical system 112 and the substrate 114 in accordance with a change in the illuminance of light applied to the substrate 114. If, however, the air tightness of the local space between the projection optical system 112 and the substrate 114 is low, it may take some time to stabilize the oxygen concentration in the local space. In addition, in consideration of interference between the exposure apparatus 1 and each unit, it is difficult to place the gas supply unit 118 (its gas supply nozzle) near the local space between the projection optical system 112 and the substrate 114. It is therefore sometimes difficult to control the oxygen concentration with high response. In such a case, it is possible to avoid a decrease in throughput by changing the illuminance of light applied to the substrate 114 instead of changing the oxygen concentration in the local space between the projection optical system 112 and the substrate 114.

Figure 9A:
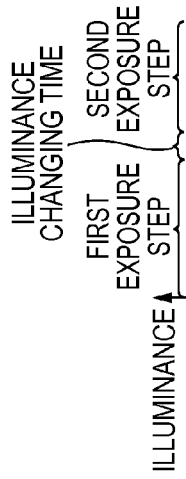
FIGS. 9A to 9D are graphs for explaining the avoidance of a decrease in throughput due to a change in the illuminance of light applied to a substrate.

The prevention of a decrease in throughput due to a change in the illuminance of light applied to the substrate 114 will be described with reference to FIGS. 9A to 9D. FIG. 9A is a graph showing the relationship between exposure time and oxygen concentration (the oxygen concentration in the local space between the projection optical system 112 and the substrate 114) in an exposure process of exposing the substrate 114 separately in the first and second exposure steps. FIG. 9A uses the exposure time as the abscissa and the oxygen concentration as the ordinate.

FIG. 9A differs from FIG. 2 in that when changing the oxygen concentration in the local space from the oxygen concentration OD1 to the oxygen concentration OD2 (that is, between the first and second exposure steps), the apparatus sets a wait time (stabilization time) for the stabilization of the oxygen concentration in the local space. As described above, when performing exposure upon changing the oxygen concentration in the local space, the apparatus requires the time between time T1 and time T5 as a stabilization time for the stabilization of the oxygen concentration in the local space. Therefore, the apparatus performs the second exposure step from time T5 to time T6. This increases the time until the completion of the exposure and decreases the throughput as compared with the process in FIG. 2.

Figure 9B:
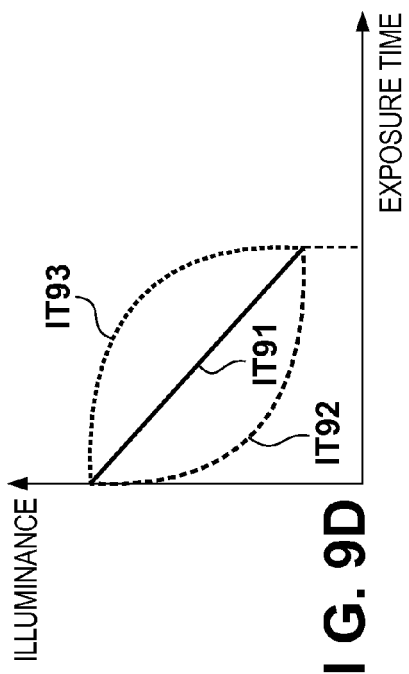

As shown in FIG. 9B, the apparatus exposes the substrate 114 upon changing the illuminance of light applied to the substrate 114 from an illuminance IR91 to an illuminance IR92 without changing the oxygen concentration in the local space between the projection optical system 112 and the substrate 114 from the oxygen concentration OD1. FIG. 9B is a graph showing the relationship between exposure time and illuminance (the illuminance of light applied to the substrate 114) in an exposure process of exposing the substrate 114 separately in the first and second exposure steps. FIG. 9B uses the exposure time as the abscissa and the illuminance as the ordinate. The technique disclosed in Japanese Patent Laid-Open No. 61-51150 suppresses (controls) the hindrance of a photopolymerization reaction by oxygen by setting different oxygen concentrations on the substrate (changing the oxygen concentration) in the first and second exposure steps. In contrast to this, in this embodiment, the apparatus can control a photopolymerization reaction by changing the illuminance of light applied to the substrate 114 while maintaining the oxygen concentration in the local space between the projection optical system 112 and the substrate 114 constant. More specifically, in the first exposure step, the apparatus exposes the substrate 114 upon setting the illuminance of light applied to the substrate 114 to the illuminance IR91 from time 0 to time T1. In the interval from time T1 to time T7, the apparatus changes the illuminance of light applied to the substrate 114 from the illuminance IR91 to the illuminance IR92. In the second exposure step, the apparatus exposes the substrate 114 while the illuminance of light applied to the substrate 114 is set to the illuminance IR92 from time T7 to time T8. With this operation, the time (illuminance changing time) required to change the illuminance between the first and second exposure steps is the time interval from time T1 to time T7. That is, the stabilization time can be shortened compared with that (from time T1 to time T5) in FIG. 9A.

The apparatus changes the illuminance of light applied to the substrate 114 in the light source 102 or the dimming unit 104, as described above. It is possible to change the illuminance in the light source 102 or the dimming unit 104 either by mechanical switching or by electrical changing means. It is therefore possible to change the illuminance of light applied to the substrate 114 in a time shorter than that required to stabilize the oxygen concentration in the local space between the projection optical system 112 and the substrate 114.

Figure 9C:
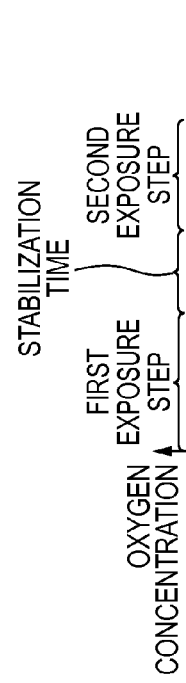

The apparatus may change the illuminance of light applied to the substrate 114 stepwise separately in the first exposure step, the second step, . . . , the nth exposure step, as shown in FIG. 9C, instead of exposing the substrate 114 separately in the first and second exposure steps (that is, two steps). This can more finely control a photopolymerization reaction on a resist and decrease the line width of a pattern transferred onto the substrate 114.

Figure 9D:
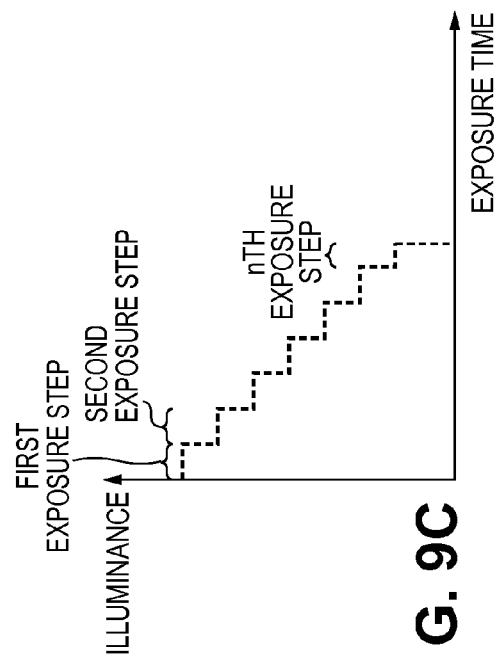

The apparatus may continuously change the illuminance of light applied to the substrate 114 during one exposure step (during the irradiation of the substrate 114 with light from the projection optical system 112), as shown in FIG. 9D, instead of exposing the substrate in multiple steps (stepwise). This eliminates the necessity of the time (illuminance changing time) required to change the illuminance as shown in FIG. 9B, and hence can increase the throughput. In addition, the apparatus may linearly change the illuminance of light applied to the substrate 114 as indicated by IT91 or may curvilinearly the illuminance as indicated by IT92 and IT93. In other words, the apparatus may change the illuminance of light applied to the substrate 114 so as to make the dimensions of a pattern transferred onto the substrate 114 fall within allowable ranges. Note that IT91 to IT93 indicate the relationship between exposure time and illuminance in a case in which the apparatus continuously changes the illuminance of light applied to the substrate 114.

Figure 10:
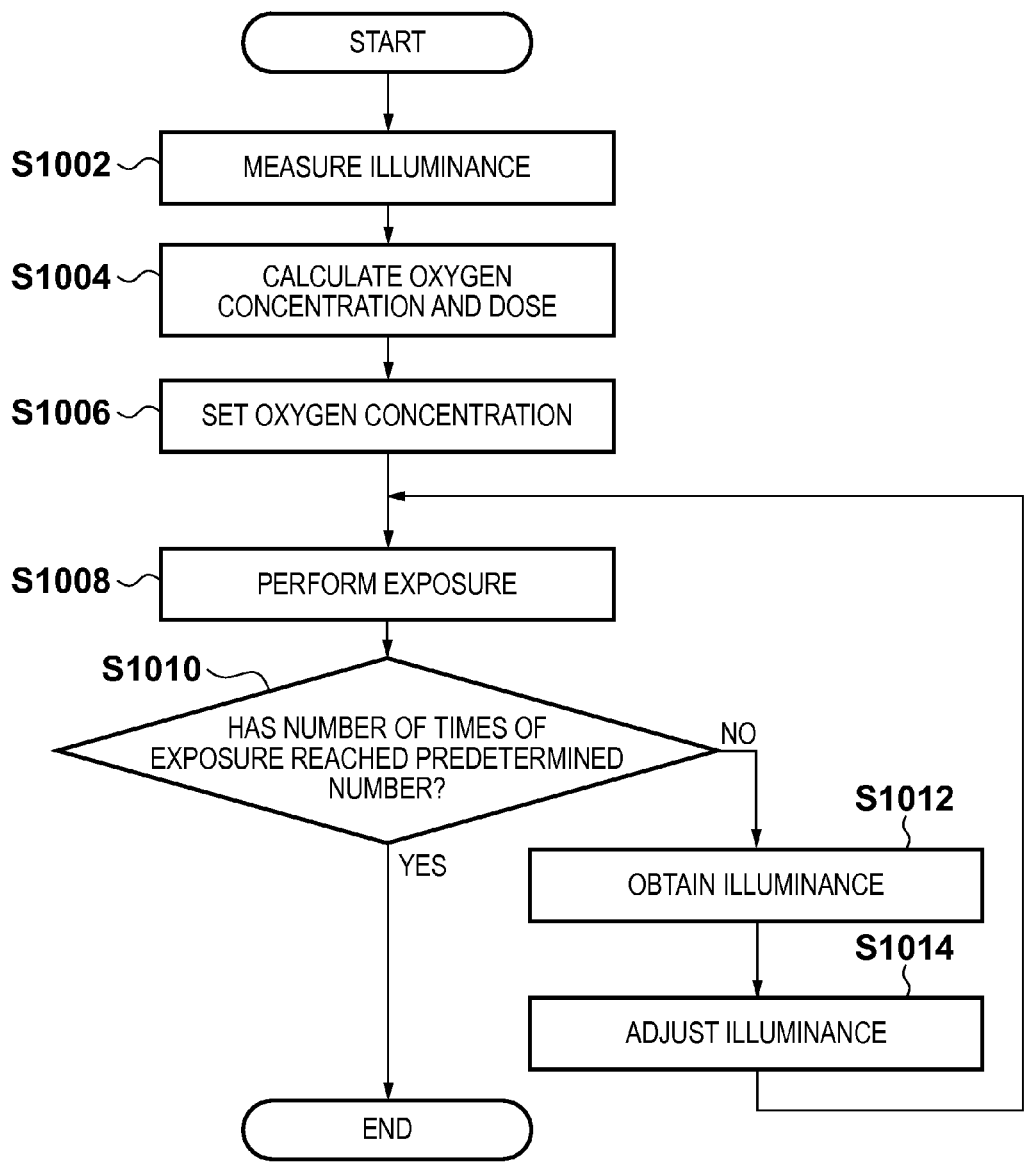
FIG. 10 is a flowchart for explaining an example of an exposure process in the exposure apparatus shown in FIG. 1.

An exposure process in a case in which the apparatus changes the illuminance of light applied to the substrate 114 will be described with reference to FIG. 10. Such an exposure process is an exposure process of exposing the substrate 114 separately in the first exposure step, the second exposure step, . . . , the nth exposure step. As described above, the control unit 128 performs this process by comprehensively controlling the respective units of the exposure apparatus 1. Since the processing in steps S1002 to S1008 is the same as that in steps S702 to S708 shown in FIG. 7, a detailed description of the processing will be omitted.

In step S1010, the apparatus determines whether the number of times of exposure has reached a predetermined number (n), that is, the nth exposure step is complete. If the number of times of exposure has reached the predetermined number, the apparatus terminates the processing. If the number of times of exposure has not reached the predetermined number, the process shifts to step S1012.

In step S1012, the control unit 128 obtains the data of the illuminance of light applied to the substrate 114 in the next exposure step from the illuminance information stored in the storage unit 130.

In step S1014, the control unit 128 adjusts the illuminance of the light applied to the substrate 114. More specifically, the control unit 128 controls the light intensity of light emitted from the light source 102 and the transmittance at the dimming unit 104 so as to set the illuminance of light applied to the substrate 114 to the illuminance obtained in step S1012.

As described above, in the exposure process shown in FIG. 10, if the number of times of exposure has not reached the predetermined number, the apparatus adjusts (changes) the illuminance of light applied to the substrate 114 instead of setting (changing) the oxygen concentration in the local space between the projection optical system 112 and the substrate 114. This can make the dimensions of a pattern transferred onto the substrate 114 fall within allowable ranges while further increasing the throughput as compared with the exposure process shown in FIG. 7.

As described above, the exposure apparatus 1 can transfer the pattern on the reticle 108 onto the substrate 114 while suppressing a reduction in throughput. The exposure apparatus 1 can therefore economically provide high quality devices (semiconductor devices, liquid crystal display devices, flat panel displays (FPDs), and the like) with high throughput. Such devices are manufactured by using the exposure apparatus 1 through the step of exposing a substrate (wafer, glass plate, or the like) coated with a photoresist (photosensitizing agent), the step of developing the exposed substrate, and other known steps.

A form of placing a light source outside an exposure apparatus and guiding light from the light source to the illuminance optical system of the exposure apparatus also forms one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-284352 filed on Dec. 27, 2012, which is hereby incorporated by reference herein in its entirety.

What is claimed is:

1. An exposure apparatus which exposes a substrate, the apparatus comprising:
an illumination optical system configured to illuminate a mask using light from a light source;
a projection optical system configured to irradiate the substrate with light from a pattern on the mask;
an adjustment unit configured to adjust an oxygen concentration in a space between the projection optical system and the substrate;
a measuring unit configured to measure an illuminance of light applied to the substrate; and
a control unit configured to control the measuring unit so as to measure illuminances of light applied to the substrate a plurality of times during irradiation of the substrate with light from the projection optical system, configured to calculate, based on the illuminance measured on a first time of the plurality of times, an oxygen concentration value corresponding to the measured illuminance on the first time and calculate, based on the illuminance measured on a second time of the plurality of times, an oxygen concentration value corresponding to the measured illuminance on the second time and configured to control the adjustment unit so as to set the oxygen concentration in the space to the calculated oxygen concentration value on the first time and the second time.

2. The apparatus according to claim 1, wherein the control unit calculates an oxygen concentration value in the space which is required to make a value of an evaluation index of a pattern transferred onto the substrate fall within an allowable range in correspondence with the measured illuminance, and controls the adjustment unit so as to set the oxygen concentration in the space to the oxygen concentration value calculated in correspondence with the measured illuminance.

3. The apparatus according to claim 1, wherein the control unit controls the adjustment unit so as to continuously change the oxygen concentration in the space based on the measured illuminance during irradiation of the substrate with light from the projection optical system.

4. The apparatus according to claim 1, wherein the control unit controls the adjustment unit so as to change the oxygen concentration in the space stepwise based on the measured illuminance during irradiation of the substrate with light from the projection optical system.

5. The apparatus according to claim 1, wherein a transfer process of transferring the pattern of the mask onto the substrate is a process of exposing the same shot region on the substrate a plurality of times to transfer one pattern onto the shot region, and
the control unit controls the measuring unit to measure illuminances of light applied to the substrate every time the exposure is performed the plurality of times, and controls the adjustment unit every time exposure is performed the plurality of times based on the measured illuminances.

6. The apparatus according to claim 1, wherein the control unit adjusts an illuminance of light applied to the substrate during irradiation of the substrate with light from the projection optical system.

7. The apparatus according to claim 1, wherein the control unit controls the adjustment unit so as to make a value of an evaluation index of a pattern transferred onto the substrate fall within an allowable range.

8. The apparatus according to claim 1, wherein the adjustment unit is a supply unit configured to supply of an inert gas to the space.

9. An exposure apparatus which exposes a substrate, the apparatus comprising:
an illumination optical system configured to illuminate a mask using light from a light source;
a projection optical system configured to irradiate the substrate with light from a pattern on the mask;
an adjustment unit configured to adjust an oxygen concentration in a space between the projection optical system and the substrate; and
a control unit configured to control the adjustment unit while an image of a pattern on one mask is transferred onto one shot region on the substrate by exposing the one shot region a plurality of times using the one mask, and configured to control illuminance of light applied to the substrate on the plurality of times so that the illuminance on a first time of the plurality of times is different from the illuminance on a second time of the plurality of times.

10. The apparatus according to claim 9, wherein the control unit continuously changes an illuminance of light applied to the substrate on the plurality of times.

11. The apparatus according to claim 9, wherein the control unit changes an illuminance of light applied to the substrate stepwise on the plurality of times.

12. The apparatus according to claim 9, wherein the control unit controls adjustment unit so as to make a value of an evaluation index of a pattern transferred onto the substrate fall within an allowable range.

13. A device fabrication method comprising steps of:
exposing a substrate using an exposure apparatus according to claim 1; and
performing a development process for the substrate exposed.

14. A device fabrication method comprising steps of:
exposing a substrate using an exposure apparatus according to claim 9; and
performing a development process for the substrate exposed.

15. An exposure apparatus which exposes a substrate, the apparatus comprising:
an illumination optical system configured to illuminate a mask using light from a light source;
a projection optical system configured to irradiate the substrate with light from a pattern on the mask;
a supply unit configured to supply a gas to a space between the projection optical system and the substrate; and
a control unit configured to obtain data of illuminances of light applied to the substrate a plurality of times during irradiation of the substrate with light from the projection optical system, configured to calculate, based on the illuminance of a first time of the plurality of times, an oxygen concentration value corresponding to the illuminance of the first time and calculate, based on the illuminance of a second time of the plurality of times, an oxygen concentration value corresponding to the illuminance of the second time and configured to control supply of the gas by the supply unit so as to set the oxygen concentration in the space to the calculated oxygen concentration value on the first time and the second time.

16. A device fabrication method comprising the steps of:
exposing a substrate using an exposure apparatus according to claim 15; and
performing a development process for the substrate exposed.

* * * * *